(12) United States Patent
Fischer et al.

(10) Patent No.: US 8,627,783 B2
(45) Date of Patent: *Jan. 14, 2014

(54) COMBINED WAFER AREA PRESSURE CONTROL AND PLASMA CONFINEMENT ASSEMBLY

(75) Inventors: Andreas Fischer, Castro Valley, CA (US); Akira Koshiishi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1222 days.

This patent is subject to a terminal disclaimer.

(21) Appl. No.: 12/361,490

(22) Filed: Jan. 28, 2009

(65) Prior Publication Data

US 2010/0154709 A1    Jun. 24, 2010

Related U.S. Application Data

(60) Provisional application No. 61/139,496, filed on Dec. 19, 2008.

(51) Int. Cl.
| | | |
|---|---|---|
| C23C 16/455 | (2006.01) | |
| C23C 16/50 | (2006.01) | |
| C23C 16/505 | (2006.01) | |
| C23F 1/00 | (2006.01) | |
| H01L 21/306 | (2006.01) | |
| C23C 16/06 | (2006.01) | |
| C23C 16/22 | (2006.01) | |

(52) U.S. Cl.
USPC .............. 118/723 R; 156/345.24; 156/345.26

(58) Field of Classification Search
USPC ..................... 118/723 R; 156/345.24, 345.26
See application file for complete search history.

(56) References Cited

U.S. PATENT DOCUMENTS

4,954,201 A * 9/1990 Latz et al. ................ 156/345.43
5,919,332 A * 7/1999 Koshiishi et al. ........ 156/345.47

(Continued)

FOREIGN PATENT DOCUMENTS

| JP | 05-036808 A | 2/1993 |
| KR | 100368200 B1 | 1/2003 |
| KR | 10-2006-0039637 A | 5/2006 |

OTHER PUBLICATIONS

"International Search Report", Issued in PCT Application: PCT/US2009/068195: Mailing Date; Aug. 13, 2010.

(Continued)

*Primary Examiner* — Rudy Zervigon
(74) *Attorney, Agent, or Firm* — IPSG, P.C. Intellectual Property Law

(57) ABSTRACT

A combined pressure control/plasma confinement assembly configured for confining a plasma and for at least partially regulating pressure in a plasma processing chamber during plasma processing of a substrate is provided. The assembly includes a movable plasma confinement structure having therein a plurality of perforations and configured to surround the plasma when deployed. The assembly also includes a movable pressure control structure disposed outside of the movable plasma confinement structure such that the movable plasma confinement structure is disposed between the plasma and the movable pressure control structure during the plasma processing, the movable pressure control structure being deployable and retractable along with the movable plasma confinement structure to facilitate handling of the substrate, the movable pressure control structure being independently movable relative to the movable plasma confinement structure to regulate the pressure by blocking at least a portion of the plurality of perforations.

25 Claims, 5 Drawing Sheets

(56) References Cited

U.S. PATENT DOCUMENTS

| | | | |
|---|---|---|---|
| 6,444,085 B1 | 9/2002 | Collins et al. | |
| 7,169,256 B2* | 1/2007 | Dhindsa et al. | 156/345.47 |
| 7,578,258 B2* | 8/2009 | Fischer | 118/723 R |
| 2001/0042511 A1 | 11/2001 | Liu et al. | |
| 2004/0035532 A1 | 2/2004 | Jung | |
| 2005/0039682 A1* | 2/2005 | Dhindsa et al. | 118/723 E |
| 2005/0103442 A1 | 5/2005 | Chen et al. | |
| 2007/0068900 A1 | 3/2007 | Kim et al. | |
| 2007/0204797 A1* | 9/2007 | Fischer | 118/723 R |
| 2008/0268172 A1 | 10/2008 | Fukuda et al. | |
| 2009/0200269 A1 | 8/2009 | Kadkhodayan et al. | |

OTHER PUBLICATIONS

"Written Opinion", Issued in PCT Application; PCT/US2009/068195; Mailing Date: Aug. 13, 2010.

"International Search Report", Issued in PCT Application: PCT/US2009/068195: Mailing Date: Aug. 13, 2010.

"Written Opinion", Issued in PCT Application: PCT/US2009/068195; Mailing Date: Aug. 13, 2010.

"International Search Report", Issued in PCT Application No. PCT/US2009/068189: Mailing Date: Jul. 2. 2010.

"Written Opinion", Issued in PCT Application No. PCT/US2009/068189; Mailing Date: Jul 2, 2010.

"Plasma Confinement Structures in Plasma Processing Systems", U.S. Appl. No. 12/361,494, filed Jan. 28, 2009.

"International Preliminary Report on Patentability", issued in PCT Application No. PCT/US2009/068189; Mailing Date: Jun. 30, 2011.

"Non Final Office Action", U.S. Appl. No. 12/361,494, Mailing Date: Nov. 23, 2012.

\* cited by examiner

COMBINED WAFER AREA PRESSURE CONTROL AND PLASMA CONFINEMENT ASSEMBLY

PRIORITY CLAIM

This application is related to and claims priority under 35 U.S.C. §119(e) to a commonly assigned provisional patent application entitled "COMBINED WAFER AREA PRESSURE CONTROL AND PLASMA CONFINEMENT ASSEMBLY," by Fischer et al., Application Ser. No. 61/139, 496 filed on Dec. 19, 2008, all of which are incorporated herein by reference.

BACKGROUND OF THE INVENTION

Plasma processing systems have long been employed to process substrates (e.g., wafers) in plasma processing systems. In a typical plasma processing chamber, plasma is ignited and confined in a plasma confinement region, which is typically defined by the chamber upper and lower strictures, as well as by structures that annularly surround the plasma confinement region.

To facilitate the insertion and removal of substrates, as well as to facilitate the evacuation of exhaust gas from the plasma processing chamber, many chambers employ a set of movable confinement rings to annularly confine the plasma. The movable confinement rings can be lifted upward, for example, to facilitate substrate insertion and removal. Generally speaking, the spacing between adjacent rings of the movable confinement rings is dimensioned to permit exhaust gas to be evacuated through the spacing while presenting a barrier to plasma expansion (e.g., by making the spacing smaller than the plasma sheath). In this manner, it is possible to physically constrain the plasma while allowing exhaust gas removal to occur through the set of movable confinement rings.

To facilitate discussion, FIG. 1 shows a simplified diagram of a portion of a prior art capacitively-coupled plasma processing chamber 100. There is shown a lower electrode 102 for supporting a substrate (not shown) during processing. Lower electrode 102 is typically powered by an RF power source (not shown) to generate and sustain a plasma 104. For process control purposes, it is desirable to confine plasma 104 within a plasma confinement region defined generally by lower electrode 102, upper electrode 106 (which may be grounded or powered by the same or another RF power source), and annularly by a set of confinement rings 110 (including rings 110a-d). As mentioned, gaps between confinement rings 110 allow exhaust gas to be pumped from the chamber while keeping the plasma confined within the aforementioned plasma confinement region. Confinement rings 110 may be made of a suitable material, such as quartz.

In the example of FIG. 1, there is also shown an annular grounded electrode 112 surrounding lower electrode 102. Annular grounded electrode 112 may be unslotted or may be slotted to provide additional flow channels for evacuating exhaust gas from the chamber as shown in the example of FIG. 1. Generally speaking, annular grounded electrode 112 is formed of a conductive material such as aluminum, and is electrically isolated from lower electrode 102 by an insulator (not shown). Grounding of grounded electrode 112 is accomplished by coupling grounded electrode 112 to an RF ground, typically by hard-bolting grounded electrode 112 or connecting it via one or more straps to a conductive lower ground extension that is disposed below lower electrode 112.

To prevent the metallic material of annular grounded electrode 112 from being exposed to the corrosive plasma and possibly contaminating the plasma process, the surface of annular grounded electrode 112 may be covered with a suitable material, such as quartz. As in the case with the set of confinement rings 110, the slots in annular grounded electrode 112 (and the overlying layer of quartz) are dimensioned to permit exhaust gas evacuation while preventing plasma from expanding beyond the plasma confinement region. The use of both confinement rings 110 and annular grounded electrode 112 in plasma processing chambers is known and will not be elaborated further here.

Generally speaking, confinement rings 110 are electrically floating, i.e., having no direct coupling to DC ground or RF ground. Since confinement rings 110 tend to be some distant away from RF ground in the prior art, no appreciable RF current flows through the set of confinement rings.

Since confinement rings 110 are left electrically floating and no appreciable RF current flows through confinement rings 110, a low voltage "floating" sheath is developed at the surface of confinement rings 110 during plasma processing. Since the energy of ions accelerated from the plasma is governed by the sheath potential, a low sheath potential results in a low energy level of ion bombardment on the surfaces of the confinement rings. Consequently, film removal processes such as sputtering and ion-enhanced etching (such as those occurring during in-situ plasma clean processes) are relatively inefficient at the surface of the confinement rings. Furthermore, a higher quantity of deposition is left on the surface of the confinement rings alter processing due to the low ion bombardment energy. By comparison, other regions of the chamber experiencing higher ion bombardment energy will see a higher film removal rate during film removal processes and a lower level of film deposition during substrate processing.

The net result is that the confinement rings tend to accumulate residues at a higher rate (relative to chamber regions that experience a higher ion bombardment energy) during substrate processing, and these residues tend to be removed more slowly (relative to chamber regions that experience a higher ion bombardment energy) during plasma in-situ chamber clean processes. These factors necessitate more frequent and/or longer in-situ chamber clean cycles (such as waferless auto-clean or WAC cycles) to keep the confinement rings in a satisfactory condition and may even require, in some cases, halting processing altogether so that the confinement rings can be removed and cleaned and/or replaced. As a consequence, the substrate throughput rate is disadvantageously reduced, leading to lower productivity and a higher cost of ownership for the plasma processing tool.

In certain chambers, control of the exhaust gas conductance rate (i.e., the rate at which exhaust gas is evacuated from the chamber) is an important control knob for controlling the wafer area pressure (WAP), i.e., the pressure above the substrate during processing. A high exhaust gas conductance rate tends to result in a lower wafer area pressure and vice versa. Given that wafer area pressure is a critical process parameter to control in many processing applications, improved methods and apparatus for controlling the wafer area pressure are constantly sought after by process engineers.

Embodiments of the invention seek to address one or more of the residue problem associated with prior art plasma confinement mechanisms, the plasma unconfinement issue, and the need to more efficiently control the wafer area pressure via exhaust gas conductance rate control.

SUMMARY OF INVENTION

The invention relates, in an embodiment, to a combined pressure control/plasma confinement assembly configured for confining a plasma and for at least partially regulating pressure in a plasma processing chamber during plasma processing of a substrate. The assembly includes a movable plasma confinement structure having therein a plurality of perforations and configured to surround the plasma when deployed. The assembly also includes a movable pressure control structure disposed outside of the movable plasma confinement structure such that the movable plasma confinement structure is disposed between the plasma and the movable pressure control structure during the plasma processing, the movable pressure control structure being deployable and retractable along with the movable plasma confinement structure to facilitate handling of the substrate, the movable pressure control structure being independently movable relative to the movable plasma confinement structure to regulate the pressure by blocking at least a portion of the plurality of perforations.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF VARIOUS EMBODIMENTS

Figure 1:
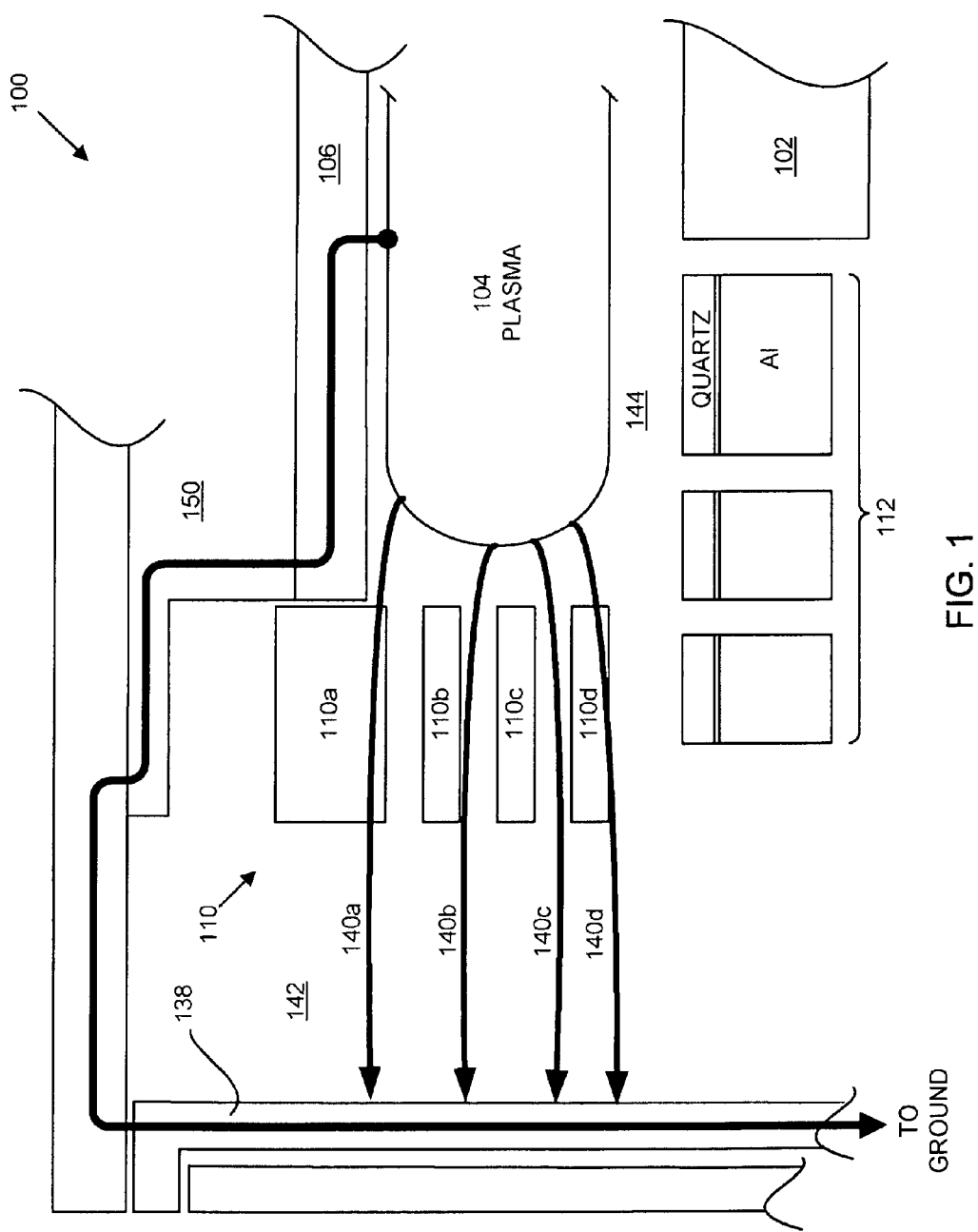
FIG. 1 shows a simplified diagram of a portion of a prior art capacitively-coupled plasma processing chamber.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Generally speaking, one or more embodiments of the invention relate to improved methods and arrangements for processing substrates in a plasma processing chamber while reducing residue accumulation on the confinement rings and/or structures that face the plasma. In one or more embodiments, the improvement also helps keep the plasma confined in the plasma confinement region, i.e., reducing the possibility of a plasma unconfinement event occurring in the annular outer region outside of the aforementioned plasma confinement region. In one or more embodiments of the invention, the improvement also includes a mechanism for efficiently, and in a simple, robust manner, controlling the exhaust gas conductance rate in order to affect control of the wafer area pressure.

In one or more embodiments of the invention, a combined WAP control/plasma confinement assembly is provided. The combined WAP control/plasma confinement assembly includes at least a movable plasma confinement structure that is both process-compatible and well-coupled to RF ground. In an embodiment, the movable plasma confinement structure includes a movable plasma-facing structure (which may be formed of quartz, doped SIC or another similarly suitable material) and a movable electrically conductive structure coupled to the back of the movable plasma-facing structure to provide a RF current path to ground. That is, one side of the movable plasma-facing structure faces the plasma, and the other side is coupled to the movable electrically conductive structure, which is shielded from the plasma by the movable plasma-facing structure.

In practice, a small gap may be provided (about 0.01 inch, in an example) between the movable plasma-facing structure and the movable electrically conductive structure to accommodate thermal expansion. Grooves, shoulders, fasteners, spacers, and other known mechanical coupling techniques, the details of which are not germane to the present invention, may be employed to achieve the coupling of the movable plasma-facing structure with the movable electrically conductive structure while leaving the aforementioned thermal expansion gap in between.

The movable plasma confinement structure that comprises the movable plasma-facing structure and the attached electrically conductive structure moves up and down as a single unit during substrate insertion and removal. The movable plasma confinement structure is perforated with holes or slots and in the down (deployed) position, rests on a hard stop and makes RF contact thereto, as will be discussed later in one or more embodiments. In an embodiment, the plasma-facing structure represents a cylindrical-shaped quartz inner sleeve, and the electrically conductive structure represents a cylindrical-shaped anodized aluminum outer sleeve that is disposed outside of and coupled to the cylindrical-shaped quartz inner sleeve. In an embodiment, the plasma-facing structure represents a doped-SiC cylinder and the electrically conductive structure represents a ring-shaped anodized aluminum mount that is disposed above and coupled to the doped-SiC cylinder.

One skilled in the art will readily appreciate that the function of the movable plasma facing structure is primarily to provide an etch resistant or a plasma process compatible structure while the function of the movable electrically conductive structure is primarily to provide a low impedance path to RF ground. In one or more embodiments, both of these functions are fulfilled by an electrically conductive structure having an etch resistant and/or process compatible layer or coating that is disposed on or deposited on the movable electrically conductive support structure.

During plasma processing, the movable plasma confinement structure provides a low impedance path from the plasma to RF ground. The combined WAP control/plasma confinement assembly further includes one or more flexible conductive straps coupled to the movable electrically conductive structure to provide the RF current a low impedance path from the upper electrode or upper assembly to RF ground, which is typically the chamber wall or another electrically conductive structure that is coupled to RF ground.

In an embodiment, one or more additional bottom RF contacts may be provided to shorten the RF current path to ground when the movable plasma confinement structure is in a deployed position during substrate processing. As will be explained later herein, the shortening of the RF current path when the plasma is present helps reduce the capacitive coupling and the inductive coupling in the annular outer region outside of the plasma confinement region, thereby reducing the possibility of inadvertently igniting and/or sustaining unconfined plasma in this annular outer region.

In one or more embodiments, the movable plasma confinement structure is perforated to allow exhaust gas to be evacuated through the perforations, with the perforations being dimensioned to physically prevent the plasma from expanding beyond the plasma confinement region. The movable plasma confinement structure is configured to rest on top of a hard stop in its deployed position. In an embodiment, the hard stop represents the annular grounded electrode or a ground extension. In one or more embodiments, the movable plasma confinement structure is also in RF contact with the annular grounded electrode or the ground extension in the deployed position.

The combined WAP control/plasma confinement assembly further includes a movable WAP control structure, which is disposed outside of the movable plasma confinement structure (i.e., at a greater distance from the substrate center). The movable WAP control structure, which may be formed of a non-conducting and etch resistant material and is not perforated, may be raised or lowered relative to and independent of the deployed movable plasma confinement structure to control the rate at which exhaust gas is evacuated from the chamber through the perforations in the movable plasma confinement structure, thereby controlling the wafer area pressure.

The features and advantages of embodiments of the invention may be better understood with reference to the figures and discussions that follow.

Figure 2:
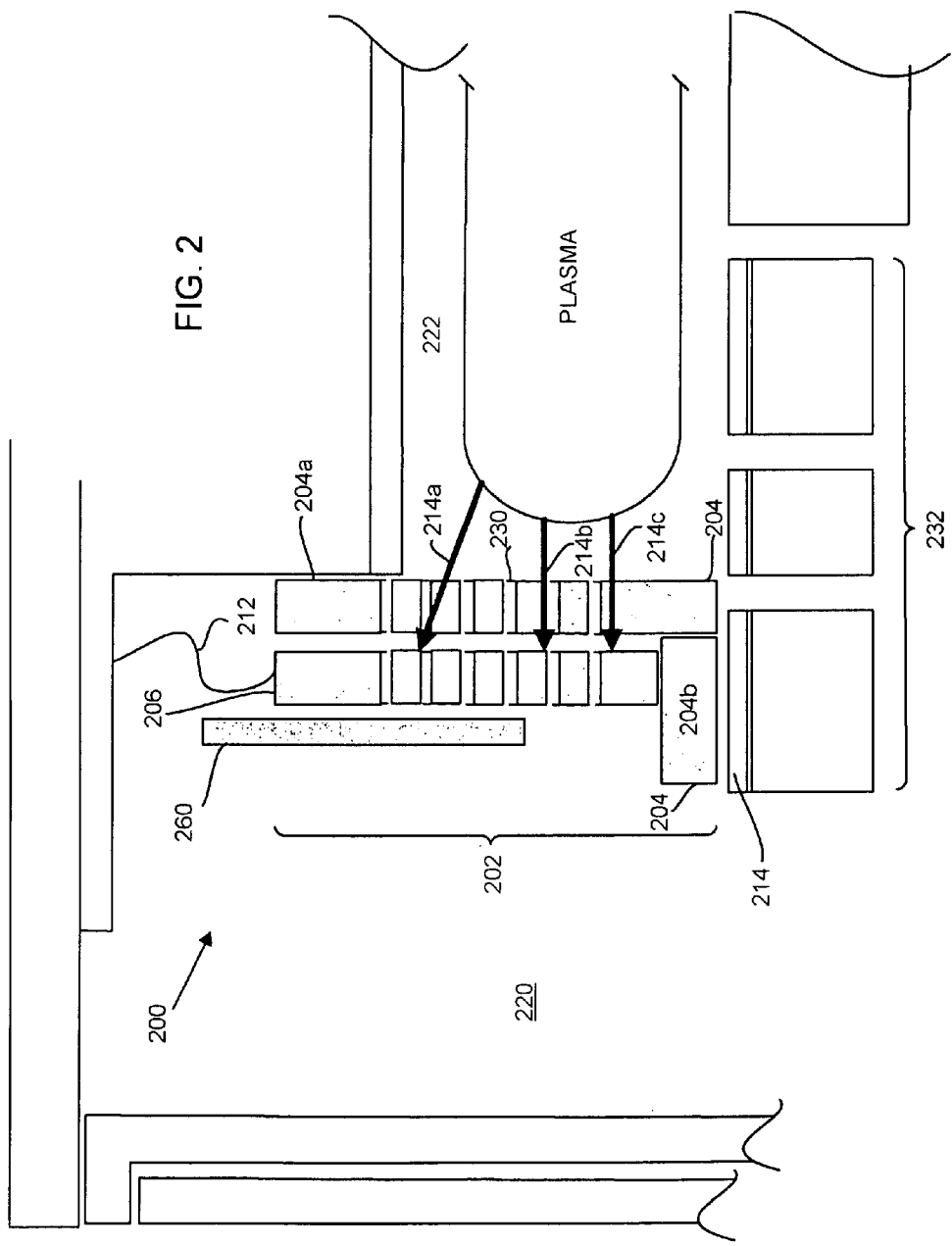
FIG. 2 shows, in accordance with an embodiment of the present invention, a simplified portion of a plasma processing chamber including combined WAP control/plasma confinement assembly.

FIG. 2 shows, in accordance with an embodiment of the present invention, a simplified portion of a plasma processing chamber including the combined WAP control/plasma confinement assembly 200. It should be noted that the figures shown herein are not to scale and some details have been simplified in order to highlight the more relevant features of the invention for discussion purposes.

The combined WAP control/plasma confinement assembly 200 includes movable plasma confinement structure 202 that includes a movable plasma-facing structure 204 and a movable electrically conductive structure 206. In some cases, both movable plasma-facing structure 204 and a movable electrically conductive structure 206 are implemented by a conductive component that is coated with a plasma-facing coating that is etch resistant and compatible with the plasma process. In the example of FIG. 2, movable plasma-facing structure 204 is implemented by a cylindrical-shaped quartz sleeve 204a and a horizontal quartz ring 204b, although any other suitable material that is compatible with the plasma process may be employed. Cylindrical-shaped quartz sleeve 204a faces the plasma during processing, while horizontal quartz ring 204b protects movable electrically conductive structure 206 from exposure to plasma during plasma processing and/or exhaust gas evacuation.

Movable electrically conductive structure 206 is implemented in the example of FIG. 2 by a cylindrical-shaped anodized aluminum sleeve that backs cylindrical-shaped quartz ring 204a. Although anodized aluminum is employed, any suitable conductive material may also be employed.

Movable electrically conductive structure 206 provides a low impedance path for RF current that traverses the thin material of cylindrical-shaped quartz ring 204a. One or more flexible conductive straps 212 couple movable electrically conductive structure 206 to a grounded chamber component, such as the chamber top plate as shown in the example of FIG. 2 or to some other grounded chamber component. In an embodiment, multiple conductive straps may be disposed around the circumference of the cylindrical-shaped anodized aluminum sleeve to provide multiple paths to ground and cylindrical symmetry for the returning RF current. As mentioned, it is desirable in some cases to provide a thermal expansion gap between movable plasma-facing structure 204 and movable electrically conductive structure 206.

To facilitate substrate insertion and removal into the chamber, movable plasma confinement structure 202 (including both movable plasma-facing structure 204 and movable electrically conductive structure 206) may be moved up and down as needed. The specific mechanism employed for achieving the linear translation in the up/down direction may be any type of transducer and/or gearing, including electro-mechanical, air-actuated, etc., which has been described in prior art. Flexible conductive strap 212 flexes to accommodate the movement of movable plasma confinement structure 202 while maintaining the desired low impedance path to ground. Flexible conductive strap 212 are covered with an etch resistant coating or sleeve on both sides to protect it from wear caused by residual ions or radical species that may advance into annular outer region 220 outside of the plasma confinement region.

During plasma processing, movable plasma confinement structure 202 is lowered into a deployed position as shown in FIG. 2. In the deployed position, movable plasma confinement structure rests on top of a hard stop, such as annular grounded electrode 232. Exhaust gas may be evacuated through perforations (e.g., perforation 230) formed in movable plasma confinement structure 202. These perforations may assume any shape and are dimensioned to permit exhaust gas evacuation while presenting a barrier to plasma expansion to prevent the occurrence of a plasma unconfinement event in the annular outer region 220 outside of plasma confinement region 222. The perforations may be slots in an embodiment and may be oriented vertically as well as horizontally or both. Although the slots are shown to be horizontal in the example of FIG. 2, they may be vertical slots to provide short, direct RF current paths to ground through movable plasma confinement structure 202. Additionally, slots may be (but not required to be) placed in the annular grounded electrode 232, to provide additional exhaust gas conductance while maintaining plasma confinement, as described in prior art.

Since there is a low impedance RF current path to ground, the plasma sheath voltage that is developed at the surface of plasma-facing structure 204 will be higher than in the case of FIG. 1, where the confinement rings are electrically floating. The higher plasma sheath voltage results in a higher ion bombardment energy, which reduces residue accumulation on plasma-facing structure 204 during processing and increases residue removal during plasma cleaning processes. Furthermore, the higher ion energy bombardment also heats up the plasma-facing surfaces of movable plasma confinement structure 202, further contributing to a reduction of residue accumulation during processing and an increase in residue removal during plasma cleaning processes.

The presence of electrically conductive structure 206 also helps reduce the occurrence of unwanted unconfinement plasma events in annular outer region 220. With reference back to FIG. 1, since quartz confinement rings 110 are electrically floating, a capacitive field is set up with field lines emanating from the plasma and terminating at grounded chamber surfaces 138 outside of confinement rings 110. These field lines are shown as field lines 140a-d, for example. The presence of a capacitive field in the annular outer region 142 outside of plasma confinement region 144 increases the possibility that plasma may be inadvertently ignited and/or sustained in this annular outer region 142, i.e., an unconfined plasma event.

In the embodiment of FIG. 2, however, most capacitive field lines emanating from the plasma terminate at movable electrically conductive structure 206 (shown by field lines 214a-c). Although some field lines may traverse movable plasma-facing structure 204 and gap 214 under movable plasma confinement structure 202 to terminate at other grounded components, the fact that field lines 214a-c no longer traverse annular outer region 220 substantially reduces and/or eliminates the presence of a capacitive field in annular outer region 220. By substantially reducing and/or eliminating the presence of a capacitive field in annular outer region 220, it is less likely that unconfined plasma may be formed and/or sustained in annular outer region 220.

There is also shown in FIG. 2 a movable WAP control structure 260, representing a non-perforated structure that can be raised and/or lowered independently relative to movable plasma confinement structure 202 when movable plasma confinement structure 202 is deployed against the aforementioned hard stop. As WAP control structure 260 is lowered, a greater number of the perforations (and/or a greater cross-section area of the perforation openings) of movable plasma confinement structure 202 are obstructed, or at least partially obstructed. With fewer perforations available for evacuating the exhaust gas, WAP pressure is raised. Contrarily, as WAP control structure 260 is raised, fewer of the perforations (and/or a smaller cross-section area of the perforation openings) of movable plasma confinement structure 202 are obstructed, or partially obstructed. With a greater number of perforations available for evacuating the exhaust gas, WAP pressure is lowered. In one or more embodiments, the position of WAP control structure 260 may be controlled by an actuator that moves WAP control structure 260 in response to a pressure feedback mechanism that compares the pressure sensed or derived in the water area (sensed/derived via an appropriate sensor) against a pressure set point.

Figure 3:
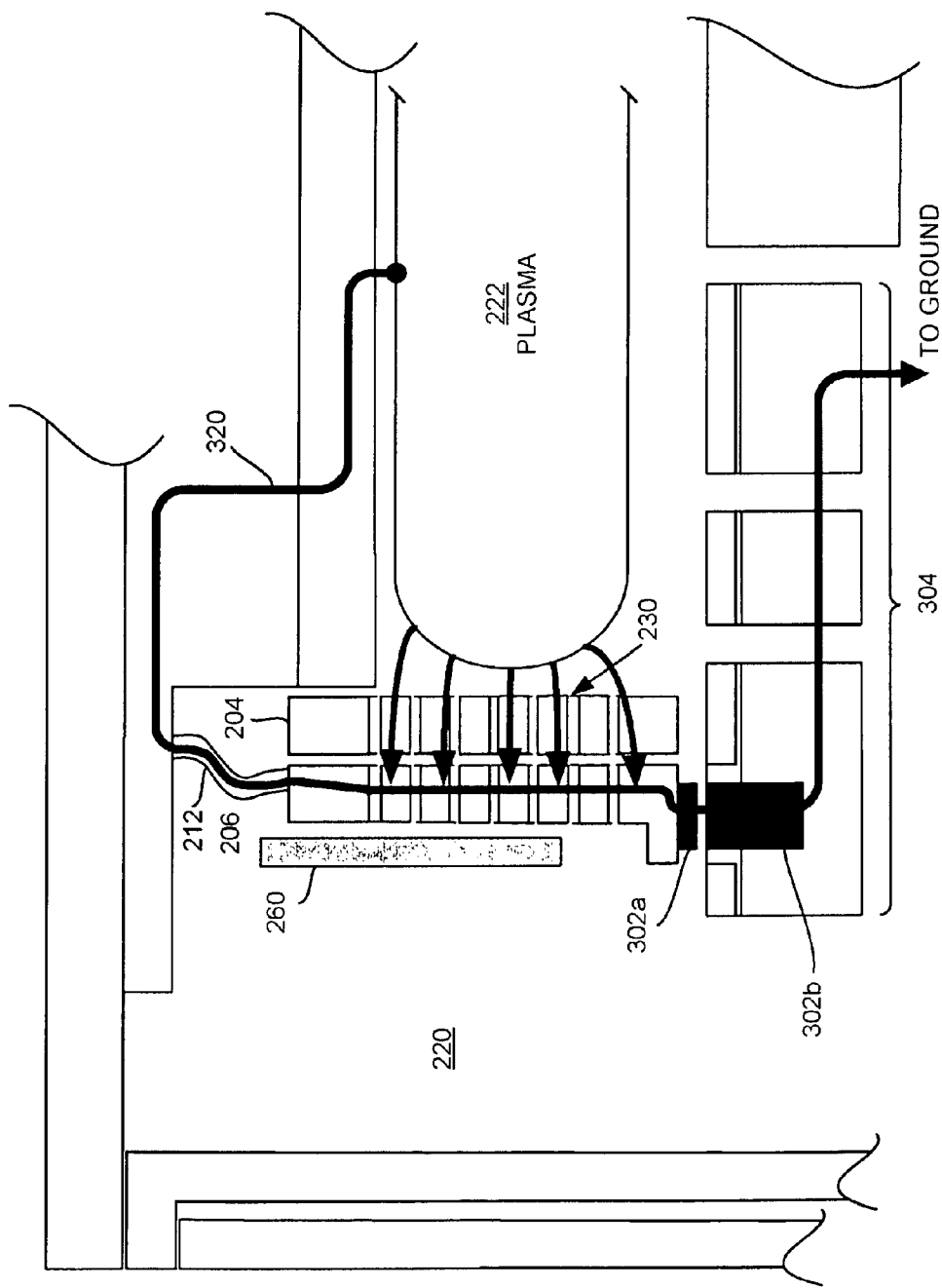
FIG. 3 shows an alternative or additional embodiment that includes a bottom RF contact for shortening the RF current path to ground.

FIG. 3 shows, in accordance with an embodiment of the present invention, an alternative or additional embodiment that includes an optional bottom RF contact for shortening the RF current path to ground and thus reducing the ground-current inductive field in annular outer region 220 to further reduce the possibility of unconfined plasma formation. Referring back to FIG. 1, RF current from the plasma follows along the low impedance path shown by arrow 150. This RF current flows along chamber walls that are adjacent to annular outer region 142 and sets up an inductive field that encourages the formation of unconfinement plasma in annular outer region 142.

In FIG. 3, a breakable RF contact 302a is provided at the bottom of movable electrically conductive structure 206. There is another corresponding breakable RF contact 302b coupled to RF ground. To ensure a good RF contact, a spring or other resilient mechanism may be employed to urge the two RE contacts 302a and 302b together when the movable plasma confinement structure is deployed and RE connectivity is desired. In an embodiment, one or each of RE contacts 302a and 302b may be mounted at least partially in a hole or depression, with the spring or resilient mechanism disposed under the RF contact at the bottom of such depression or hole to urge the RF contacts toward its counterpart to ensure good RF connectivity when the movable plasma confinement structure, including movable electrically conductive structure 206, is in a deployed position. For illustration clarity, the movable plasma confinement structure is shown only in a partially deployed position in FIG. 3, with the RF contacts not yet in physical contact with one another.

In the example of FIG. 3, corresponding breakable RF contact 302b is coupled to the conductive material of annular grounded electrode 304. In an embodiment, SiC is employed for the breakable RF contacts although any other electrically conductive material that is both compatible with the plasma process and sufficiently durable to withstand repeated contact making-and-breaking may also be employed. To increase its durability even further, RF contact 302 can be designed such that it is buried in surrounding electrode such that when the contact is closed no ions or radicals can advance toward the contact areas on 302a and 302b because they would be physically shielded.

During plasma processing, the movable plasma confinement structure is deployed in the down or deployed position, and breakable RF contacts 302a and 302b are urged together to permit RF current to flow in the direction of arrow 320 at the surface facing plasma region 222. Note that the RF current in FIG. 3 traverses movable electrically conductive structure 206 and RF contacts 302a/302b on the way to RF ground. Although most of the RF current couples directly from the plasma to movable electrically conductive structure 206 through the thin plasma-compatible coating/structure 204 in FIG. 3, some of the RF current from the plasma may couple to the upper electrode/upper assembly then returns to ground via straps 212, movable electrical conductive structure 206, and RE contacts 302a/302b. Irrespective, this is in marked contrast to the situation in FIG. 1, where the RF current flows along the chamber surfaces that are adjacent to outer annular region 142 (see arrow 150 in FIG. 1). Since RF current of FIG. 3 does not flow along the chamber surfaces that are adjacent to outer annular region 220, but rather at the inner, plasma facing surface of conductive structure 206, no inductive field is set up in this outer annular region 220 to promote the formation or sustaining of unwanted unconfinement plasma.

In the example of FIG. 3, the WAP control mechanism functions substantially in the same manner as discussed in connection with FIG. 2.

Figure 4:
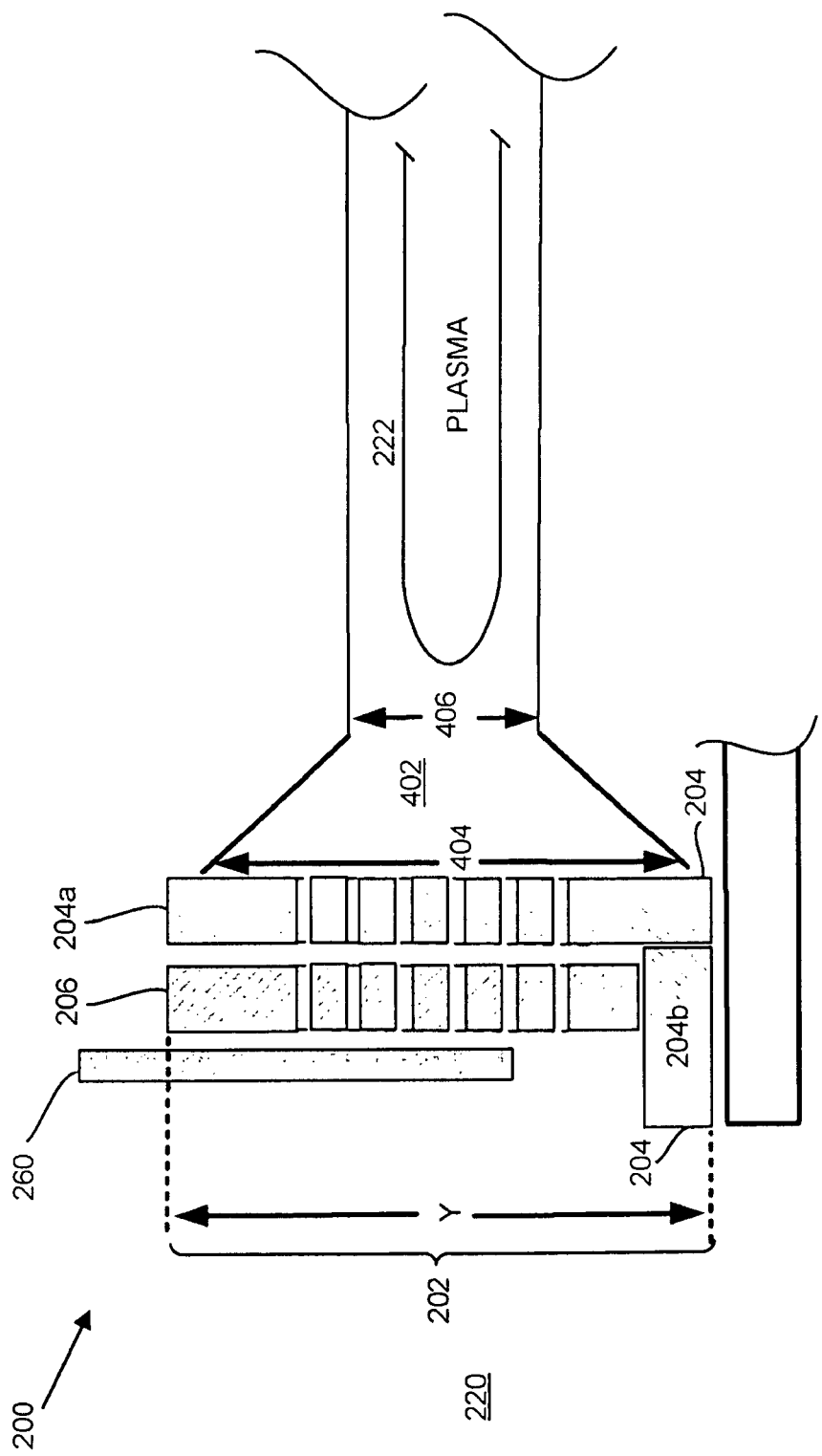
FIG. 4 shows an alternative or additional embodiment that includes an enlarged chamber periphery.

In one or more embodiments, the periphery of the plasma (defined as the annular region inside the movable plasma confinement structure but outside of the region that is directly overlying the substrate) may be enlarged to allow improved exhaust gas conductance and/or a greater range of control for exhaust gas conductance. With reference to FIG. 4, chamber periphery 402 may be enlarged to have a greater vertical dimension 404 than the gap dimension 406 between the upper electrode and the lower electrode. With this enlargement, the combined WAP control/plasma confinement assembly may be made with a greater Y dimension and/or with more perforations and/or longer slots to permit WAP control to be performed with a greater range and granularity. An enlarged chamber periphery is particularly useful for improving WAP control for plasma chambers having a small gap between the upper and lower electrode.

In an embodiment, the WAP control structure is coupled to the same plunger employed to raise/lower movable plasma confinement structure. Although the embodiment of FIG. 5 is a preferred embodiment, other methods of lowering/raising the movable WAP control structure independently of the movable plasma confinement structure to control the exhaust gas evacuation rate (and the wafer area pressure or WAP) may also be employed.

Figure 5:
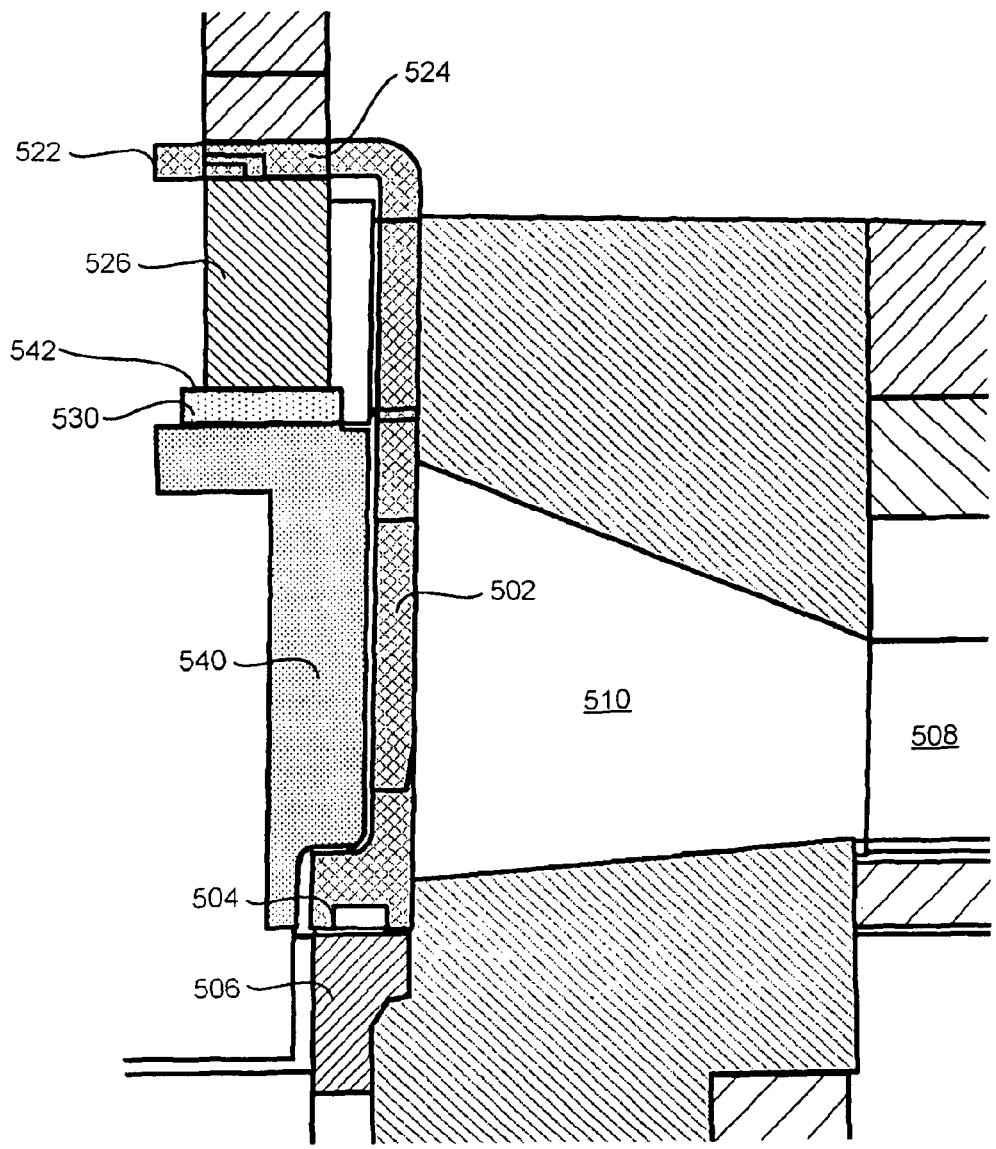
FIG. 5 shows in accordance with an embodiment of the invention, the details of a combined WAP control/plasma confinement assembly, including the WAP control structure, the movable plasma confinement structure, and the plunger employed to raise/lower the combined WAP control/plasma confinement assembly.

With reference to FIG. 5, movable plasma confinement structure 502 is shown in the fully deployed position with a lower end 504 resting on a grounded hard stop 506. Slots (which may have any shape and disposed in any direction, including vertical) are disposed in cylindrical movable plasma confinement structure 502 to facilitate exhaust gas evacuation from within the plasma confinement region 508 via enlarged plasma periphery 510.

An upper end 522 of movable plasma confinement structure 502 is provided with a through-hole 524 to allow a plunger shaft 526 to freely slide or traverse through through-hole 524 as plunger shaft 526 moves down and up to deploy or retract movable plasma confinement structure 502. Plunger shaft 526 is coupled to a stop 530 as shown. It should be noted that the diameter of stop 530 needs to be larger than through-hole 524. However, in order to allow sliding, the diameter of plunger shaft 526 needs to be smaller than through-hole 524.

A movable WAP control structure 540 is coupled to or hangs from stop 530. As plunger shaft 526 and stop 530 move upward from the current fully deployed, fully-choked condition, movable WAP control structure 540 is moved upward by plunger shaft 526/stop 530 independently of movable plasma confinement structure 502 until shoulder 542 of stop 530 contacts the lower surface of upper end 522 of movable plasma confinement structure 502. At this point, the larger dimension of stop 530 (relative to through-hole 524) allows shoulder 542 to urge the lower surface of upper end 522 of movable plasma confinement structure 502 upward as plunger shaft 526 and stop 530 continue to move upward. From that point on, both movable WAP control structure 540 and movable plasma confinement structure 502 retract to permit substrate insertion and removal.

To deploy movable plasma confinement structure and to control the position of movable WAP control structure, plunger shaft 526 and stop 530 move downward from the fully stowed (up) position. As plunger shaft 526 and stop 530 move downward mobile plasma confinement structure 502 riding on stop 530 also moves downward until lower end 504 contacts hard stop 506. At that point, movable plasma confinement structure 502 stops its downward movement. As plunger shaft 526 and stop 530 move downward further, WAP control structure 540 is lowered independently of the position of movable plasma confinement structure 502 to control the exhaust evacuation rate as discussed earlier.

As can be appreciated from the foregoing, embodiments of the invention contribute to the reduction of residue formation on the plasma confinement structure surfaces during processing and also contribute to the improvement of residue removal during in-situ plasma clean processes. The presence of the movable electrically conductive structure for terminating capacitive field lines emanating from the plasma also renders it less likely that unwanted unconfinement plasma would be ignited and/or sustained in the outer annular region by a capacitive field. The use of a breakable RF contact creates a shorter RF current path to ground that bypasses the chamber wall surfaces adjacent to the outer annular region of the chamber also substantially reduces and/or eliminates the possibility that unwanted unconfined plasma would be ignited and/or sustained by an inductive field in the outer annular region of the chamber. WAP control is efficiently achieved through the use of the WAP control mechanism that obstructs a variable number of perforations in the plasma confinement structure depending on the position of the WAP control mechanism relative to the position of the movable plasma confinement structure. For chambers having a small gap between the upper and lower electrodes, an enlarged plasma periphery helps improve WAP control granularity and increases overall gas conductance. These improvements help improve wafer throughput and process control, leading to a lower cost of ownership and improved yield.

While this invention has been described in terms of several embodiments, there are alterations, permutations, and equivalents, which fall within the scope of this invention. It should also be noted that there are many alternative ways of implementing the methods and apparatuses of the present invention. For example, although the annular grounded electrode is discussed in the example to have slots or channels to improve exhaust gas evacuation, it is also possible to practice the invention using a grounded electrode without any exhaust hole or slot (such as a simple lower ground extension without any slot or hole for exhaust gas conductance). Although various examples are provided herein, it is intended that these examples be illustrative and not limiting with respect to the invention.

Furthermore, embodiments of the present invention may find utility in other applications. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. It should also be noted that there are many alternative ways of implementing the methods and apparatuses of the present invention if the term "set" is employed herein, such term is intended to have its commonly understood mathematical meaning to cover zero, one, or more than one member. It may be therefore intended that the following appended claims be interpreted as including all such alternations, permutations, and equivalents as fall within the true spirit and scope of the present invention.

What is claimed is:

1. A combined pressure control/plasma confinement assembly configured for confining a plasma and for at least partially regulating pressure in a plasma processing chamber during plasma processing of a substrate, comprising:
    a movable plasma confinement structure having therein a plurality of perforations and configured to surround said plasma when deployed; and
    a movable pressure control structure disposed outside of said movable plasma confinement structure such that said movable plasma confinement structure is disposed between said plasma and said movable pressure control structure during said plasma processing, said movable pressure control structure being deployable and retractable along with said movable plasma confinement structure to facilitate handling of said substrate, said movable pressure control structure being independently movable relative to said movable plasma confinement structure to regulate said pressure by blocking at least a portion of said plurality of perforations.

2. The combined pressure control/plasma confinement assembly of claim 1 wherein said movable plasma confinement structure represents a generally cylindrical-shaped structure, said plurality of perforations representing a plurality of slots disposed along an axis of said cylindrical-shaped structure.

3. The combined pressure control/plasma confinement assembly of claim 1 wherein said movable plasma confinement structure and said movable pressure control structure share a set of common plunger shafts to facilitate moving said movable plasma confinement structure and said movable pressure control structure.

4. The combined pressure control/plasma confinement assembly of claim 1 wherein said movable plasma confinement structure includes:
   a movable plasma-facing structure configured to surround said plasma; and
   a movable electrically conductive structure disposed outside of said movable plasma-facing structure and configured to be deployed and retracted with said movable plasma-facing structure as a single unit to facilitate handling of said substrate, said movable electrically conductive structure being radio frequency (RF) grounded during said plasma processing, wherein said movable plasma-facing structure is disposed between said plasma and said movable electrically conductive structure during said plasma processing such that RF current from said plasma flows to said movable electrically conductive structure through said movable plasma-facing structure during said plasma processing.

5. The combined pressure control/plasma confinement assembly of claim 4 wherein said movable plasma-facing structure is a cylindrical-shaped structure and formed of a material that is resistant to etching by said plasma.

6. The combined pressure control/plasma confinement assembly of claim 4 wherein said movable plasma-facing structure is formed of quartz.

7. The combined pressure control/plasma confinement assembly of claim 4 wherein said movable plasma-facing structure is formed of doped-SiC.

8. The combined pressure control/plasma confinement assembly of claim 4 wherein said movable plasma-facing structure is configured to shield said movable electrically conductive structure from exposure to said plasma during said plasma processing.

9. The combined pressure control/plasma confinement assembly of claim 4 further comprising a breakable RF contact disposed such that a path to ground is formed through said breakable RF contact when said movable electrically conductive structure is deployed.

10. A plasma processing system with a plasma processing chamber, comprising:
    a movable plasma confinement structure having therein a plurality of perforations and configured to surround a plasma when deployed, wherein said plasma is generated during plasma processing of a substrate within said plasma processing chamber;
    a movable pressure control structure disposed outside of said movable plasma confinement structure such that said movable plasma confinement structure is disposed between said plasma and said movable pressure control structure during said plasma processing, said movable pressure control structure being deployable and retractable along with said movable plasma confinement structure to facilitate handling of said substrate, said movable pressure control structure being independently movable relative to said movable plasma confinement structure to at least partially regulate pressure within said plasma processing chamber during said plasma processing by blocking at least a portion of said plurality of perforations; and
    a set of conductive straps coupled to a movable electrically conductive structure, wherein said set of conductive straps accommodates movement of said electrically conductive structure when said movable electrically conductive structure is deployed and retracted while providing RF current a low impedance path to ground.

11. The plasma processing system of claim 10 wherein said movable plasma confinement structure represents a generally cylindrical-shaped structure, said plurality of perforations representing a plurality of slots disposed along an axis of said cylindrical-shaped structure.

12. The plasma processing system of claim 10 wherein said movable plasma confinement structure and said movable pressure control structure share a set of common plunger shafts to facilitate moving said movable plasma confinement structure and said movable pressure control structure.

13. The plasma processing system of claim 10 wherein said movable plasma confinement structure includes:
    a movable plasma-facing structure configured to surround said plasma; and
    a movable electrically conductive structure disposed outside of said movable plasma-facing structure and configured to be deployed and retracted with said movable plasma-facing structure as a single unit to facilitate handling of said substrate, said movable electrically conductive structure being radio frequency (RF) grounded during said plasma processing, wherein said movable plasma-facing structure is disposed between said plasma and said movable electrically conductive structure during said plasma processing such that RF current from said plasma flows to said movable electrically conductive structure through said movable plasma-facing structure during said plasma processing.

14. The plasma processing system of claim 13 further comprising a breakable RF contact disposed such that said low impedance path to said ground is formed through said breakable RF contact when said movable electrically conductive structure is deployed.

15. The plasma processing system of claim 10 wherein said plasma processing chamber includes an enlarged plasma periphery region, wherein said enlarged plasma periphery region is formed inside said movable plasma confinement structure and has a vertical dimension larger than a gap dimension between an upper electrode and a lower electrode, wherein said enlarged plasma periphery region enables said movable pressure control structure to have a greater range in regulating pressure release from said plasma processing chamber.

16. A method for manufacturing a plasma processing system with a plasma processing chamber, comprising:
    providing a movable plasma confinement structure having therein a plurality of perforations and configured to surround a plasma when deployed, wherein said plasma is generated during plasma processing of a substrate within said plasma processing chamber;
    disposing a movable pressure control structure outside of said movable plasma confinement structure such that said movable plasma confinement structure is disposed between said plasma and said movable pressure control structure during said plasma processing, said movable pressure control structure being deployable and retractable along with said movable plasma confinement structure to facilitate handling of said substrate, said movable pressure control structure being independently movable relative to said movable plasma confinement structure to at least partially regulate pressure within said plasma processing chamber during said plasma processing by blocking at least a portion of said plurality of perforations; and
    coupling a set of conductive straps coupled to said movable electrically conductive structure, wherein said set of conductive straps accommodates movement of said movable electrically conductive structure when said movable electrically conductive structure is deployed and retracted while providing said RF current a low impedance path to ground.

17. The method of claim 16 further including providing a set of common plungers shared by said movable plasma confinement structure and said movable pressure control structure, wherein said set of common plungers is configured to facilitate moving said movable plasma confinement structure and said movable pressure control structure.

18. The method of claim 16 wherein said movable plasma confinement structure includes:
 a movable plasma-facing structure configured to surround said plasma; and
 a movable electrically conductive structure disposed outside of said movable plasma-facing structure and configured to be deployed and retracted with said movable plasma-facing structure as a single unit to facilitate handling of said substrate, said movable electrically conductive structure being radio frequency (RF) grounded during said plasma processing, wherein said movable plasma-facing structure is disposed between said plasma and said movable electrically conductive structure during said plasma processing such that RF current from said plasma flows to said movable electrically conductive structure through said movable plasma-facing structure during said plasma processing.

19. The method of claim 18 further including disposing a breakable RF contact between said movable electrically conductive structure and said ground such that said low impedance path to said ground is formed through said breakable RF contact when said movable electrically conductive structure is deployed.

20. The method of claim 16 wherein said movable plasma confinement structure represents a generally cylindrical-shaped structure, said plurality of perforations representing a plurality of slots disposed along an axis of said cylindrical-shaped structure.

21. The combined pressure control/plasma confinement assembly of claim 4 wherein said movable plasma-facing structure is implemented by a cylindrical-shaped quartz sleeve and a horizontal quartz ring.

22. The combined pressure control/plasma confinement assembly of claim 21 wherein said cylindrical-shaped quartz sleeve faces said plasma during said plasma processing.

23. The combined pressure control/plasma confinement assembly of claim 21 wherein said horizontal quartz ring is configured for protecting said movable electrical conductive structure from exposure to said plasma during said plasma processing.

24. The combined pressure control/plasma confinement assembly of claim 1 wherein said movable plasma confinement structure is positioned on an annular grounded electrode when said movable plasma confinement structure is deployed.

25. The combined pressure control/plasma confinement assembly of claim 1 wherein said plasma processing chamber includes an enlarged plasma periphery region, wherein said enlarged plasma periphery region is formed inside said movable plasma confinement structure and has a vertical dimension larger than a gap dimension between an upper electrode and a lower electrode, wherein said enlarged plasma periphery region enables said movable pressure control structure to have a greater range in regulating pressure release from said plasma processing chamber.

* * * * *